US005379251A

United States Patent [19]

Takeda et al.

[11] Patent Number: 5,379,251

[45] Date of Patent: Jan. 3, 1995

[54] METHOD AND APPARATUS FOR STATIC RAM

[75] Inventors: Minoru Takeda; Michio Negishi, both of Kanagawa, Japan

[73] Assignee: Sony Corporation, Tokyo, Japan

[21] Appl. No.: 60,544

[22] Filed: May 13, 1993

[30] Foreign Application Priority Data

May 15, 1992 [JP] Japan .................................. 4-148437
Jul. 30, 1992 [JP] Japan .................................. 4-223392

[51] Int. Cl.[6] ........................ G11C 11/34; H01L 27/01

[52] U.S. Cl. ....................................... 365/174; 257/66; 257/67; 257/68; 257/903; 365/154

[58] Field of Search ..................... 257/66, 67, 68, 903; 364/154, 174

[56] References Cited

U.S. PATENT DOCUMENTS 5,239,196 8/1993 Ikeda et al. .......................... 257/903
5,243,203 9/1993 Hayden et al. ........................ 257/66

*Primary Examiner*—Eugene R. LaRoche
*Assistant Examiner*—F. Niranjan
*Attorney, Agent, or Firm*—Hill, Steadman & Simpson

[57] ABSTRACT

An SRAM memory cell structure, wherein a word line is disposed near the center of a cell, each one of driver transistors is disposed on both sides thereof substantially in parallel with each other, a contact portion for a gate electrode of said driver transistor is formed being laminated on a word transistor formed together with said word line, and a semiconductor, wherein an upper transistor and a lower transistor are disposed, an overlapped portion in which at least three layers each having a diffusion region for forming each of said transistors are overlapped is formed, and a contact is taken at said overlapped portion.

5 Claims, 14 Drawing Sheets

Y
6
8
4
2
X
X'
5
1
Lw
S
5
Wd
3
7
Y'

METHOD AND APPARATUS FOR STATIC RAM

BACKGROUND OF THE INVENTION

1. Field of the Invention

The present invention concerns an SRAM memory structure. The present invention can be embodied, for example, as an SRAM memory cell structure having a thin film transistor (hereinafter sometimes simply referred to as "TFT").

2. Description of the Related Art

As an SRAM cell structure in the prior art, a TFT load type SRAM memory cell structure which is a cell structure comprising, for example, a thin film transistor has been known. FIG. 1 shows a substrate structure of a unit cell as one example of a usual CMOS-SRAM memory cell structure in which a word transistor and a driver transistor are formed on an Si substrate, TFT is laid over the upper layer portion thereof as a load device, a word line 1 is disposed at the center of the cell, and two driver transistors (electrodes of which are shown by 2 and 3) are disposed on both sides thereof substantially in parallel and in a point-to-point symmetry with respect to the center of the cell, to each other.

FIG. 2 shows a memory unit cell circuit. In FIG. 2, transistors 11, 16 are word transistors, transistors 12, 15 are driver transistors and transistors 13, 14 are TFT constituting load transistors. A portion A1 comprising the transistors 11, 12 and a portion A2 comprising the transistors 15, 16 in the figure are formed on a Si substrate.

In highly integrated memories since 4MSRAM, it is generally practiced to form word transistors and driver transistors on a Si substrate and constitute load transistors as PMOS-TFT, and FIG. 1 shows a structure for one example thereof. FIG. 1 shows only the arrangement of gate electrodes of the word transistors and the driver transistors, and contacts relevant to them. That is, an electrode 1 is a word line (corresponding to the word transistors 11, 16 in FIG. 2), electrodes 2, 3 are driver transistors (corresponding to the driver transistors 12, 15 in FIG. 2), and a portion 4 in FIG. 1 is an inter-device separation region for separating them. A signal taken out of a node contact 5 passes through the word transistor 1 and taken out of a bit contact 6 by way of a diffusion layer below the contact portion of the electrode 2. The signal is shown by S in the figure.

Now considering the stability of the memory cell, the stability is generally increased either by increasing the channel width of the driver transistor (shown by Wd) or by increasing the channel length (shown by Lw) of the word transistor.

The electrodes 1, 2 and 3 were formed in one identical step but, as can be seen from FIG. 1, the cell area is increased concerned with a design rule if the stability is intended to be improved. Further, in this existent example, a signal transmitted from the memory node 5 to the bit contact 6 has to be passed through a diffusion layer below the gate electrode 2 of the driver transistor. Therefore, this leads to problems such as increase of resistance and capacitance and difficulty for ensuring insulation voltage withstand or the like.

Further, for preparing, for example, an SRAM cell, contact hole forming steps have to be repeated for twice or three times in order to form two memory nodes in the cell and, accordingly, such increased number of steps result in the reduction of the yield.

For instance, in a case of a TFT load type cell that has been gradually employed recently in 4MSRAM cell, a method of forming at first a node contact between two driver transistors by way of a contact hole forming step, then forming a contact connecting the node and a node between two TFTs in the same way and, further, forming a node contact between the TFTs is used, which increases the number of steps.

OBJECTS AND SUMMARY OF THE INVENTION

A first object of the present invention is to provide an SRAM cell structure cap able of increasing the channel length of a word transistor without increasing a cell area, thereby improving the stability of a cell operation and also capable of overcoming problems relevant to signal transmission through a diffusion layer.

A second object of the present invention is to provide a semiconductor device and an SRAM capable of reducing the number of manufacturing steps, particularly, number of contact forming steps thereby attaining improvement for the yield, as well as a manufacturing method therefor.

DETAILED DESCRIPTION OF THE PREFERRED EMBODIMENTS

Description will now be made to the first embodiment according to the present invention with reference to the drawings.

In this embodiment, the invention of the present application is applied to an SRAM cell structure having a PMOSTFT as a load transistor.

Figure 3:
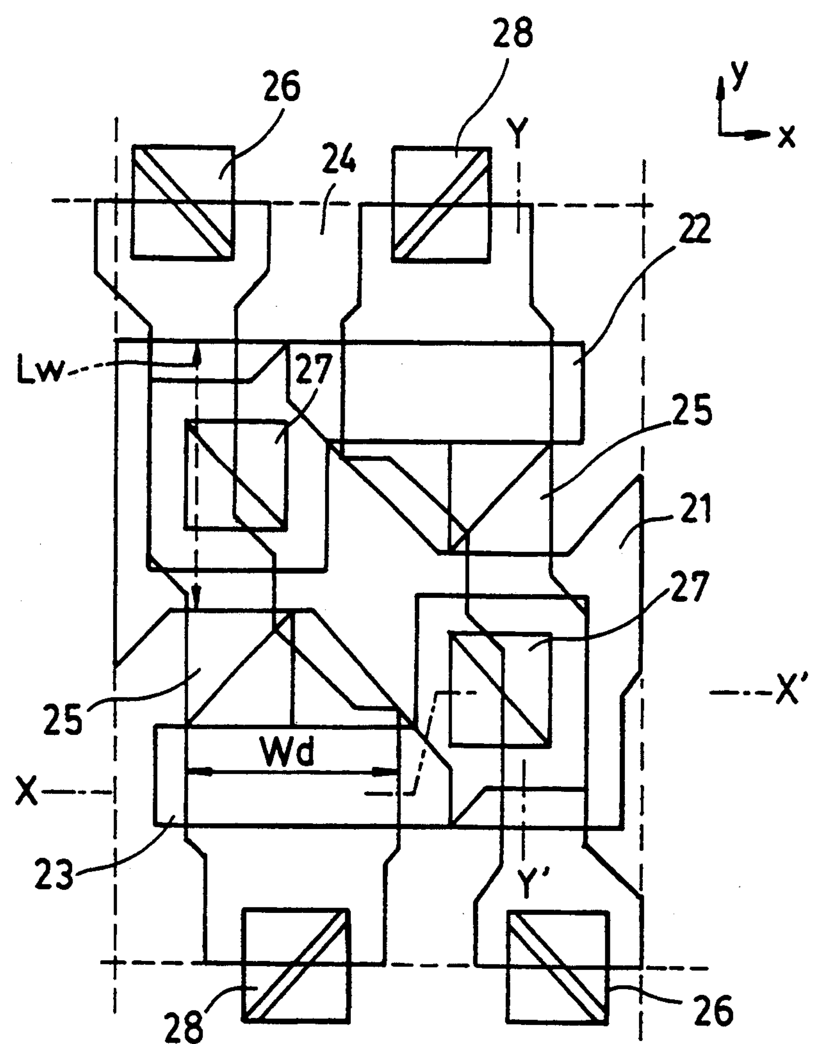
FIG. 3 is a diagram for a cell pattern of an SRAM apparatus as a first embodiment according to the present invention.
Figure 4A:
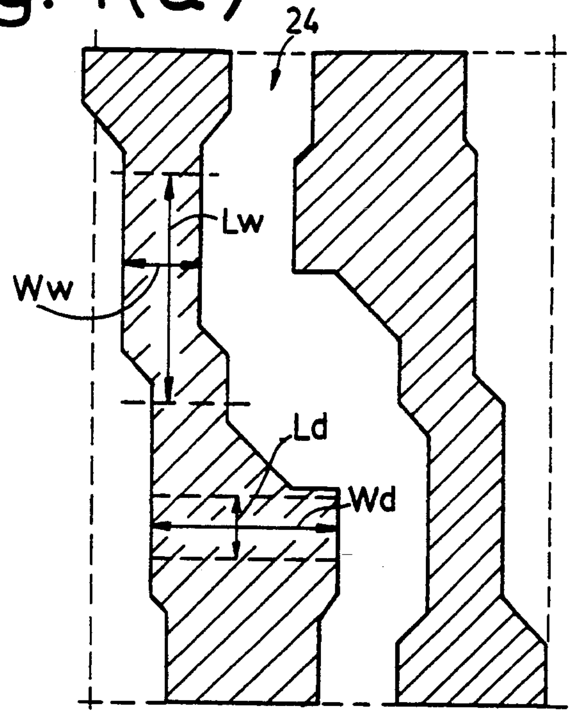
FIG. 4A to FIG. 4C are views for each of layers in the SRAM apparatus according to the present invention shown FIG. 3.
Figure 4B:
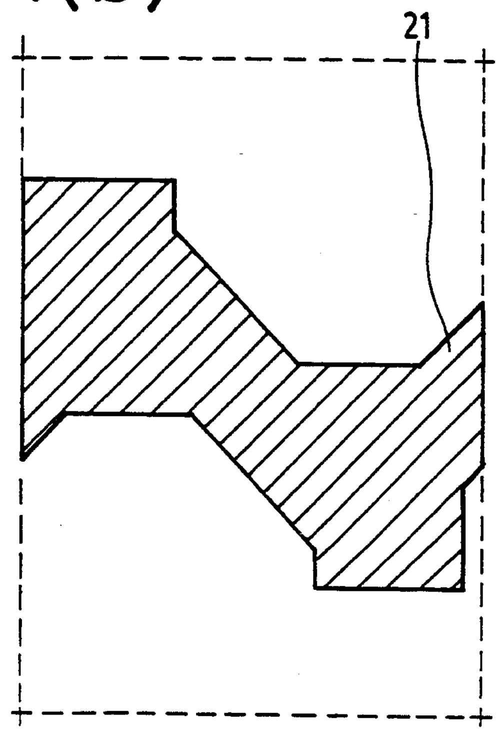
Figure 4C:
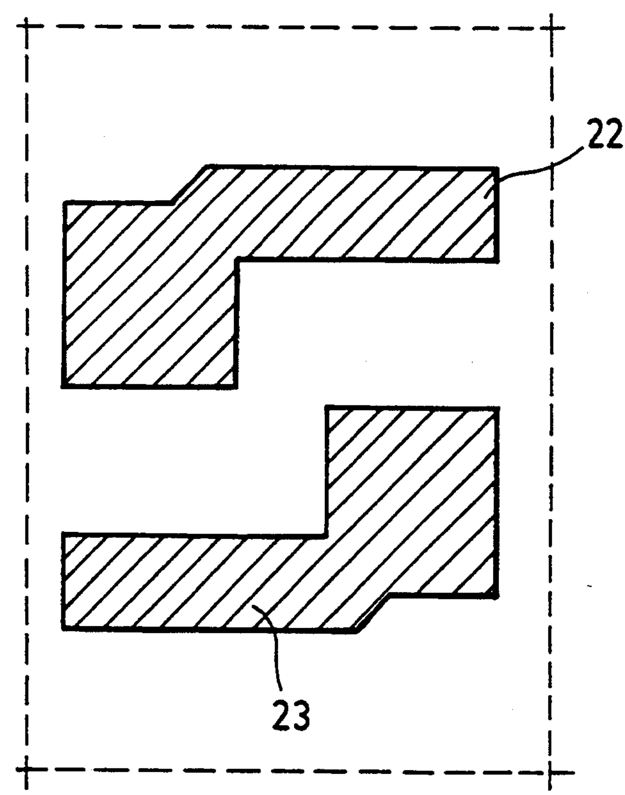

FIG. 3 shows a plan view of an SRAM memory cell structure of this embodiment. FIG. 4A through FIG. 4C are constitutional views for each of layers in this embodiment exploded from the constitution shown in FIG. 3. FIG. 4A shows a pattern of an inter-device isolation region 24 (hatched area is an active layer), FIG. 4B is a view for a word line 2J (and word transistor) and FIG. 4C is a view for driver transistor 22, 23.

In FIG. 4A, the width and the length of the word transistor channel are depicted by Ww, Lw, and the width and the length of the driver transistor channel are depicted by Wd, Ld. It is possible to form a pattern by using a Revenson type phase shift mask, in which it may be defined for the phase of right/left pattern as 0/p in FIG. 4A, the phase of upper pattern as and, that for the lower pattern is defined as p, in FIG. 4C, while the upper pattern may be defined as p and the lower pattern may be defined as 0 regarding the adjacent cell.

In FIG. 3, a signal taken out of a node contact 25 passes through the word transistor (word line 21) and led out directly from a bit contact 26 not by way of such a long diffusion layer as in the existent example.

One of the most prominent features of this structure is that a contact portion 27 of a gate electrode 22 for the driver transistor is laminated to the upper layer portion of the electrode for the channel portion of the word transistor, for example, by way of an insulating film such as silicon oxide.

An example of a step for manufacturing the SRAM memory cell in this embodiment will now be described by way of CROSS sectional views with reference to FIG. 5A through FIG. 5I. In FIG. 5A through FIG. 5I, 5A, C, E, G, I in each of the figures illustrate the constitution taken along line X—X' in FIG. 3, while 5B, D, F, H, J in each of the figures illustrate the constitution taken along line Y—Y' in FIG. 3, respectively, on every manufacturing steps.

Figure 5A:
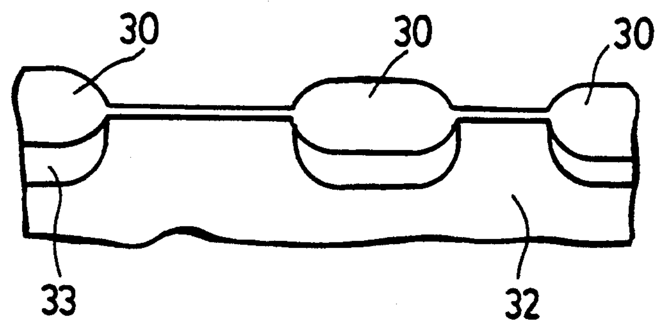
FIG. 5A to FIG. 5J illustrate a method of manufacturing the SRAM apparatus according to the present invention shown in FIG. 3.
Figure 5B:
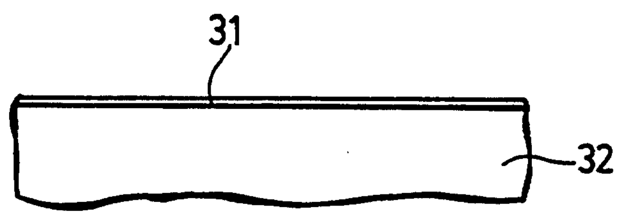

At first, as shown in FIG. 5A, FIG. 5B, a device isolation region 30 is formed and first gate oxidation is applied to form a first gate oxide film 31. In the figure, are shown a substrate 32 and a channel stop region 33.

Figure 5C:
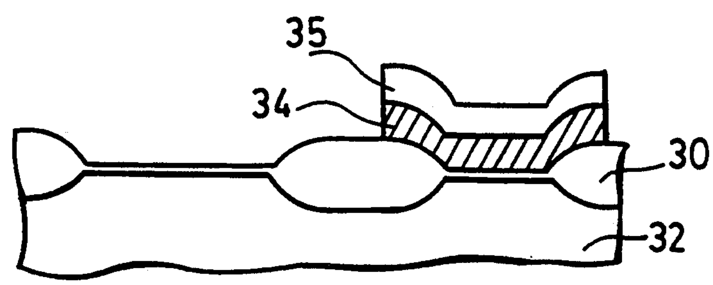
Figure 5D:
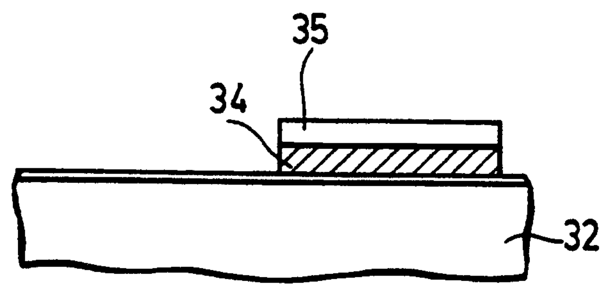

Subsequently, a word line of a word transistor 34 are formed, for example, with an electroconductive film such as poly Si. In this case, an offset insulating film 35 is formed simultaneously by using, for example, a silicon oxide film. Thus, a structure shown in FIGS. 5C, 5D is obtained.

Figure 5E:
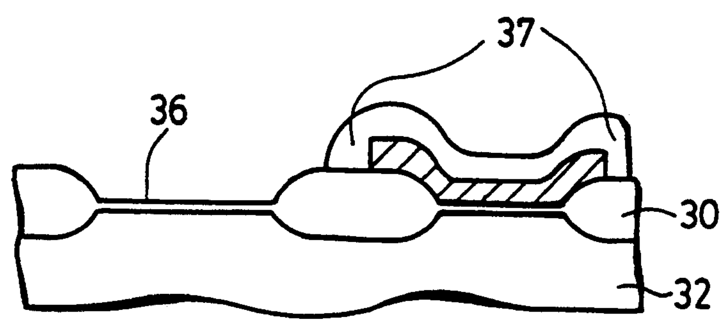
Figure 5F:
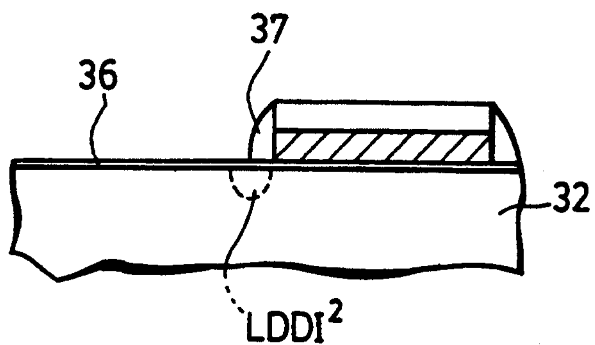

After forming LDD ion implantation and LDD side spacers 37, second gate oxidation is applied to obtain a second oxide film 36 (refer to FIGS. 5E, 5F).

Figure 5G:
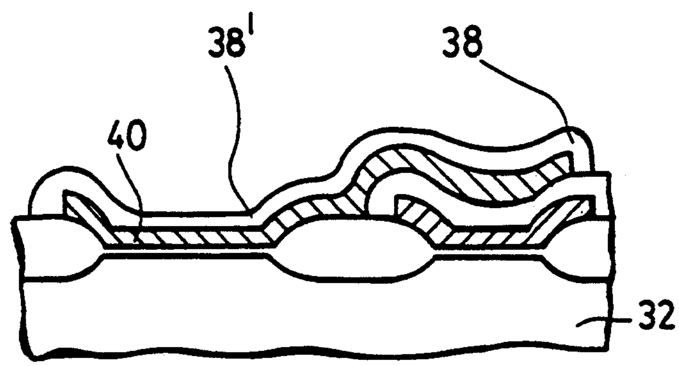
Figure 5H:
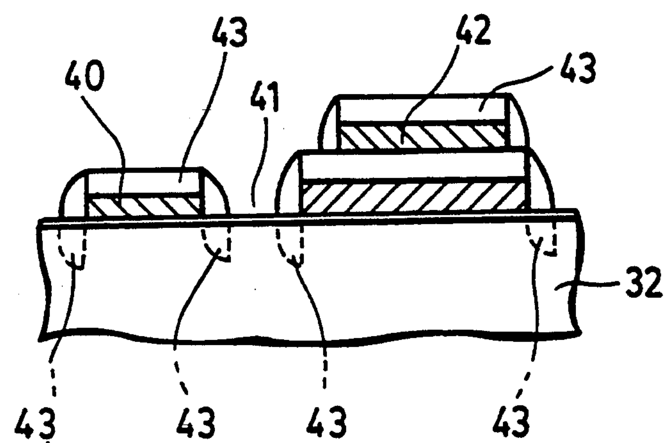
Figure 5I:
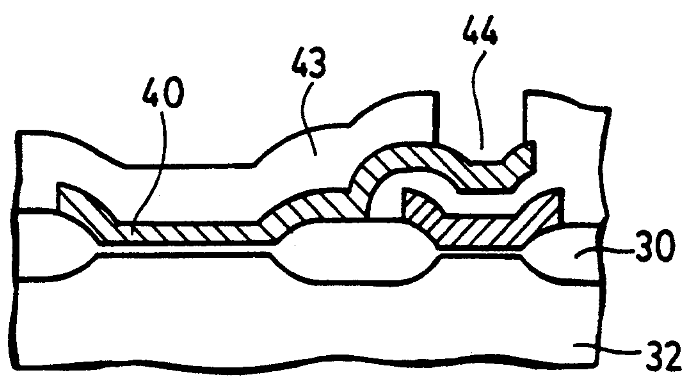
Figure 5J:
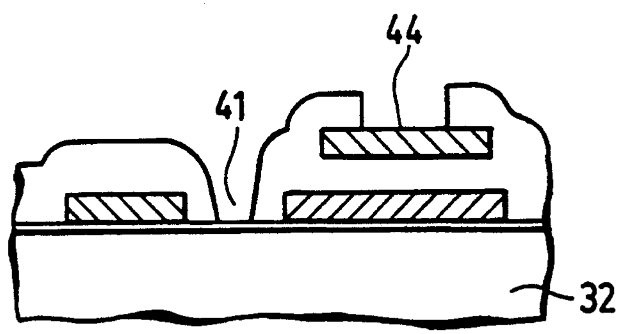
Figure 6A:
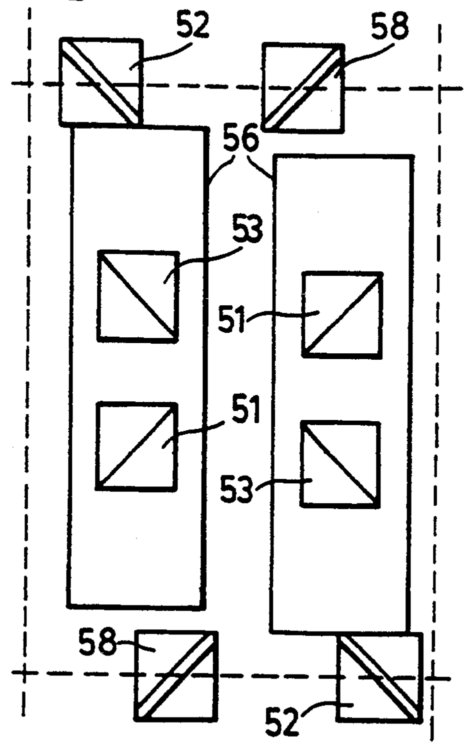
FIG. 6A to FIG. 6D are diagrams for a pattern illustrating the structure of a TFT as a second embodiment according to the present invention.
Figure 6B:
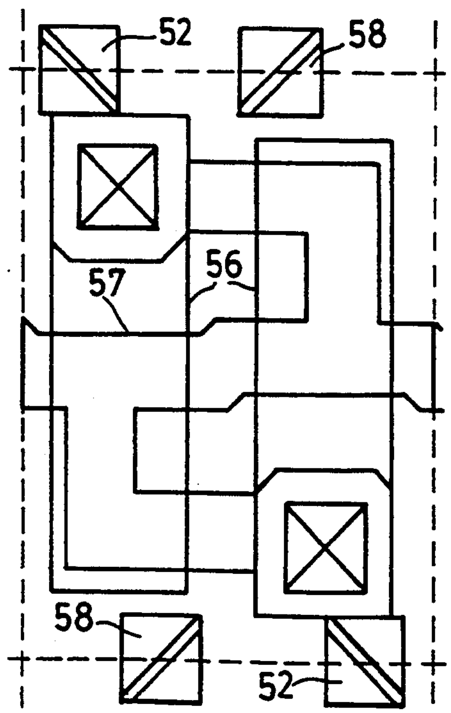
Figure 6C:
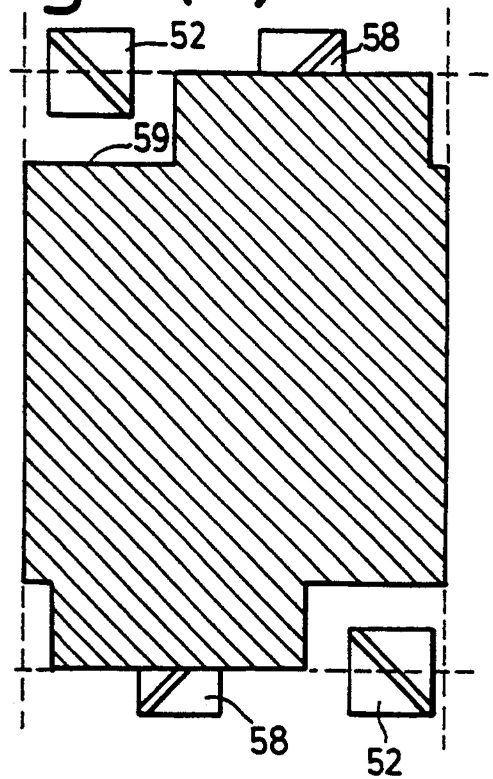
Figure 6D:
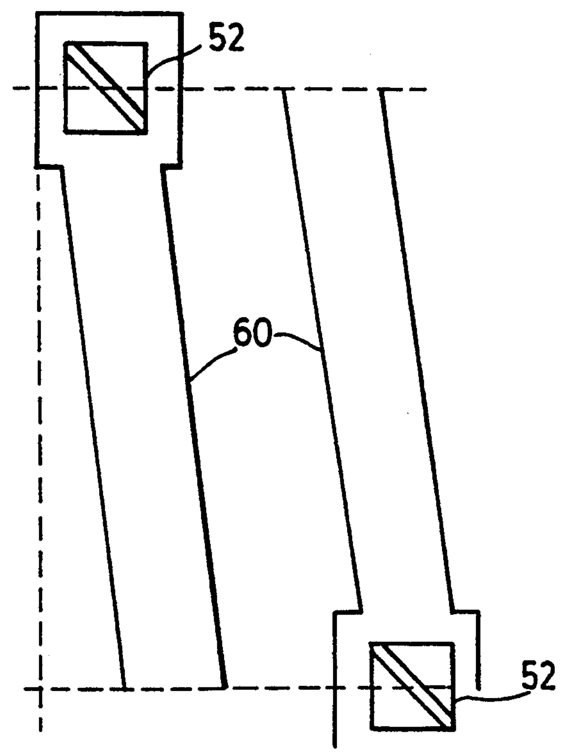

Then, a gate electrode 40 of a driver transistor is formed (FIGS. 5G, 5H). Then, after forming the LDD ion implantation and LDD side spacers 38 again, an insulating layer 38 is formed, and a TFT portion is formed to an upper layer portion to complete a memory cell. FIGS. 5I, 5J illustrate contacts 41, 44 but the contacts 41 and 44 are not opened simultaneously in view of the process. In FIGS. 5I, 5J, it is illustrated as if they were formed in one identical step for the sake of convenience, in order to clarify the positional relationship between the contacts 41 and 44.

Figure 1:
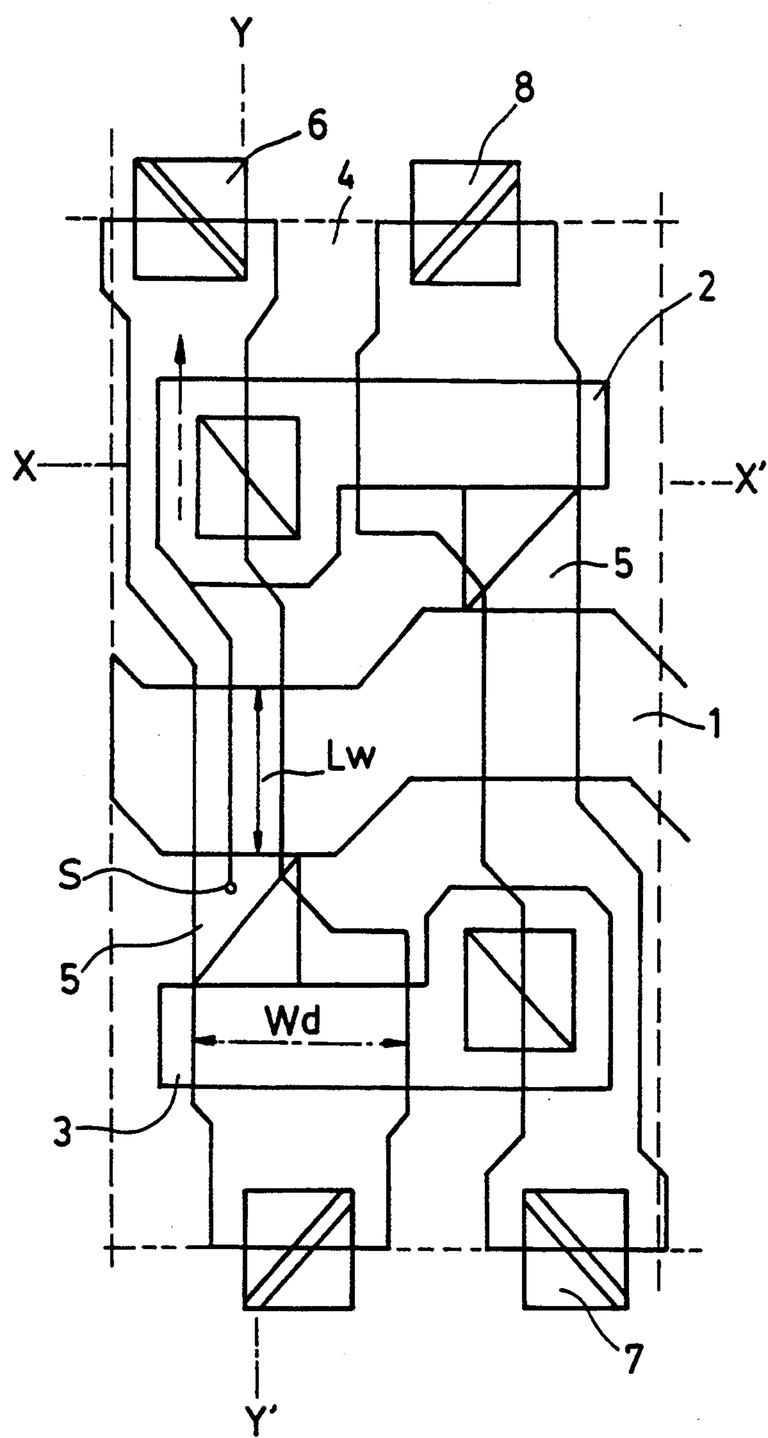
FIG. 1 is a diagram for a cell pattern of an SRAM apparatus in the related art.
Figure 2:
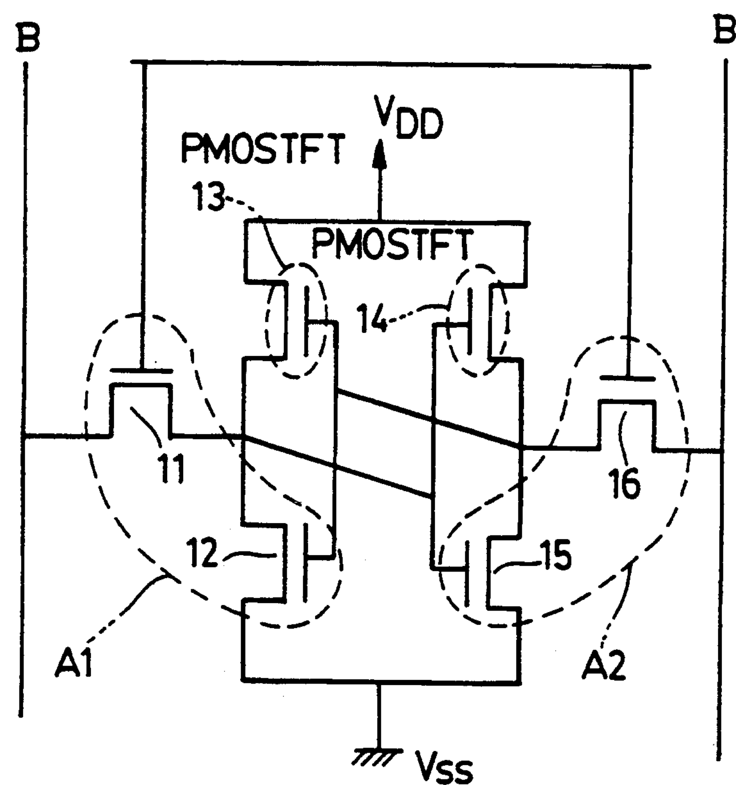
FIG. 2 is an equivalent circuit diagram of an SRAM apparatus in the related art shown in FIG. 1.

The structural feature of this embodiment is that the channel length of the word transistor can be increased by the structure as described previously. For example, when FIG. 3 is compared with FIG. 1 of the related art, the channel length of the word transistor is about 1.75 times as large as that in the related art although the vertical size is only about 70% in the related art (refer to Lw in each of the figures).

Since the lateral directions of both of the cells are identical, the channel width of the driver transistor is identical. Accordingly, stability to noise signals is improved outstandingly. By the way, b ratio is often used as a factor showing the stability. This is defined as b=(Wd. Lw)/(Ww. Ld), assuming the channel length as Lw and the channel width as Ww for the word transistor, while those of the driver transistor as Ld and Wd, respectively. b is about 4 in the related art of FIG. 1, while b is about 7 in this embodiment shown in FIG. 3.

FIG. 6A through FIG. 6D illustrate a second embodiment for the constitution of a load transistor (TFT) in the structure of this embodiment. After opening a node contact 51 and a driver gate contact 53, a conduction layer 56 as a gate of the TFT is formed by using poly Si or the like, In this embodiment, the node contact 51 can be formed by using a so-called self-aligned contact method. Further, after forming a gate insulating film, a channel portion 57 of the TFT is formed by using poly Si or the like. A line extending if the direction X along the center of the cell is utilized as Vdd (lower source line).

After completing the formation of the load transistor (TFT), a Vss contact 58 is opened, a Vss layer 59 is formed with poly Si or the like, a bit contact 52 is opened and a bit line extending in the direction Y is formed with a conduction layer 60 made of Al or the like (FIG. 6D), to complete a memory cell.

According to the SRAM memory structure in this embodiment, since the portion below the contact portion of the driver transistor gate electrode can be utilized as the word transistor, the channel length of the word transistor can be increased extremely. Accordingly, the operation stability can be improved outstandingly. Further, assuming the stability about at the same level as that in the structure of the related art, a resultant margin can be utilized for the reduction of the cell area. Further, a problem such as diffusion resistance as a drawback in the structure of the related art can be overcome completely due to the feature of this structure of utilizing all of the portions as the channel of the word transistor. This structure can be designed with the driver transistor gate being as the least rule. Further, application of the phase shift method (Revenson method) is also taken into consideration (refer to the descriptions for FIG. 4A and FIG. 4C).

As has been described above, the present invention provides an SRAM memory cell structure in which a word line is disposed near the center of the cell and each one of driver transistors is disposed on both sides thereof substantially in parallel with each other, wherein a contact portion for the gate electrode of the driver transistor is formed being laminated on a word transistor formed together with a word line.

Further, the present invention provides an SRAM memory cell structure in which a word transistor and a driver transistor are formed on a substrate and a load device is laminated on the upper layer portion thereof, wherein a word line is disposed near the center of the cell, each are of driver transistors is disposed on both sides thereof substantially in parallel with each other, a gate electrode of the driver transistor is partially laminated by-way of an insulating film to an upper layer of an electrode for a channel portion of the word transistor, and the laminated portion is used for contact with the gate electrode of the driver transistor.

Further, the present invention provides an SRAM memory cell structure as defined in claim 1, wherein the gate electrode of the driver transistor is formed after the step of forming the word line, by which the object of the present invention can be attained.

Furthermore, the present invention provides an SRAM memory cell structures as defined in any one of claims 1 to 3, wherein a word line is disposed near the center of the cell and each one of driver transistors is disposed on both sides thereof substantially in parallel and about in a point-to-point symmetry with each other, by which the object of the present invention can be attained.

According to the present invention, since the contact portion for the gate electrode of the driver transistor is formed being laminated on the word transistor formed together with the word line, a port:on below the contact portion for the driver transistor gate can be utilized as the word transistor, so that the channel length of the word transistor can be increased to thereby improve the stability of the cell operation. Further, if the stability is set to about the same extent as that in the structure of the related art, the cell area can be reduced. Furthermore, the problem such as diffusion resistance in a case of transmitting a signal through a diffusion layer can be overcome in the present invention by utilizing all of the portions thereof as the channel of the wore transistor.

Description will now be made to a third embodiment according to the present invention with reference to the drawings. It should be noted, however, that the present invention is not restricted only to the embodiment described below.

In this embodiment, the present invention is embodied as a TFT load type SRAM.

Figure 7:
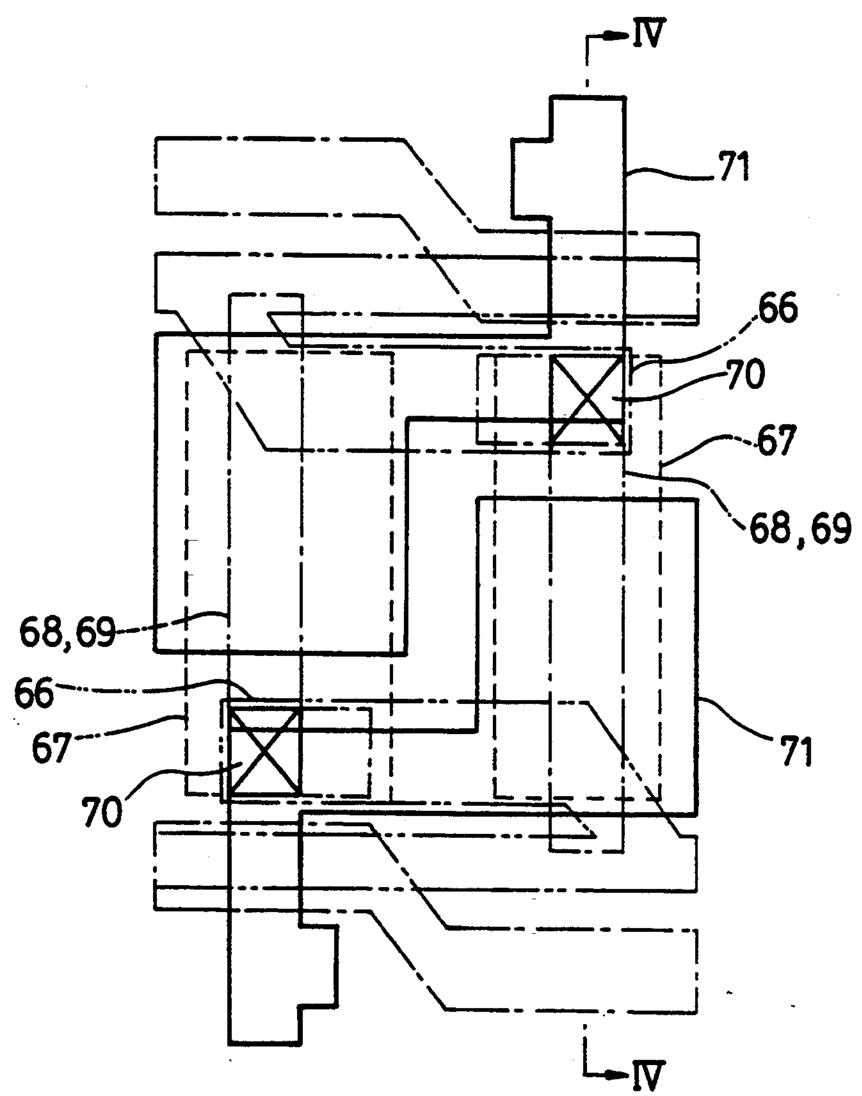
FIG. 7 is a diagram for a cell pattern of an SRAM apparatus as a third embodiment according to the present invention.

As shown in the structure of FIG. 7 viewed as a plan, this embodiment comprises layers 66, 67, 68 and 69 having a diffusion region, and at least three layers of each of diffusion regions 66, 67, 68 and 69 have an overlapped portion, and a contact 70 is taken at that portion.

In this embodiment, the layer 66 having the diffusion region is a poly Si layer for a TFT channel, a layer 67 having the diffusion region is TFT gate poly Si layer, and layers 68, 69 having diffusion regions are gate poly Si layer for driver word and transistors. The contact 70 is a contact for memory node.

Referring more specifically, FIG. 7 shows a pattern for each of the layers of a device isolation region 71 for a TFT load type SRAM cell, gate poly Si 68, 69, a TFT gate poly Si 67, a TFT channel poly Si 66, and a contact hole pattern for 67 node contacts 5. In the drawing, bit take out contact, grinding contact, grinding line poly Si pattern are omitted.

Figure 8:
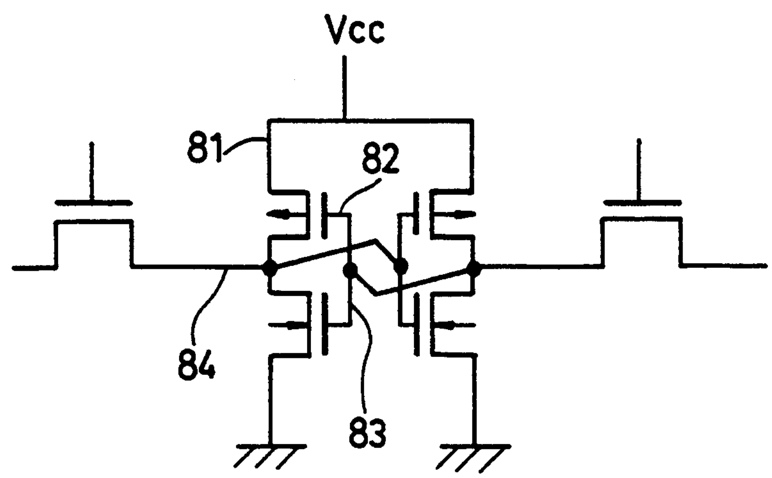
FIG. 8 is an equivalent circuit diagram of the SRAM device shown in FIG. 7.
Figure 9:
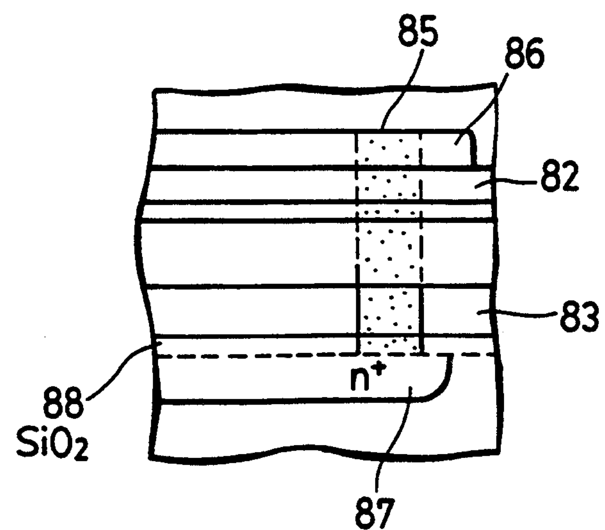
FIG. 9 is a view illustrating the constitution of a contact portion in the SRAM apparatus shown in FIG. 7.

Referring schematically, in a case of constituting a circuit shown in FIG. 8, an overlapped portion is formed for a TFT diffusion layer 86, a TFT gate 82, a gate 83 of the driver transistor and a diffusion layer 87 of the driver transistor, and a contact 85 is taken at the overlapped portion.

The SRAM in this embodiment can be formed as described below. At first, after forming a poly Si pattern of three layers 66, 67, 68 or 69 shown in FIG. 7, a hole for forming the node contact 70 is formed by a resist pattern and an interlayer film and a poly Si film are continuously etched as far as the silicon substrate.

Then, the contact hole is buried by CVD and etching back of poly Si by which :he three layers of poly Si and the silicon substrate are electrically conducted to form a memory node.

An example for the method of preparing the SRAM cell in this embodiment will now be explained more specifically referring to FIGS. 10A and 10B as below.

Figure 10A:
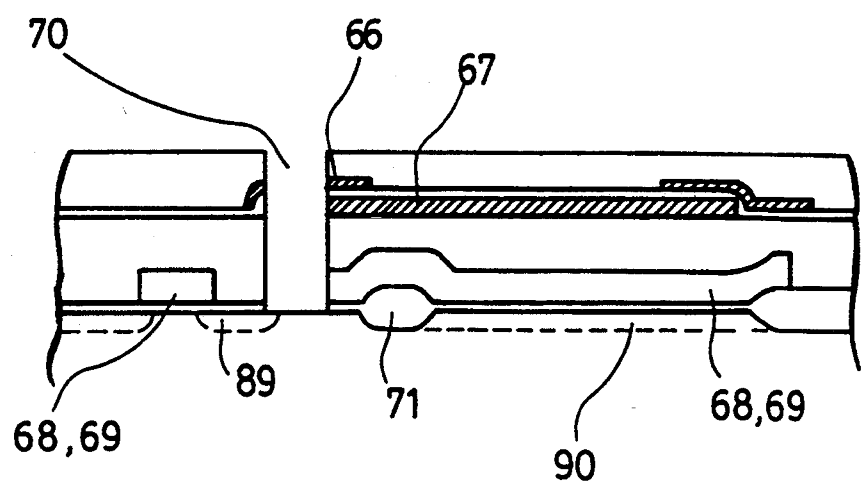
FIG. 10A and FIG. 10B illustrate a step chart for an SRAM apparatus according to the present invention.

FIG. 10A shows a cross sectional view taken along line IV—IV in FIG. 7 after forming a pattern for three poly Si layers of shown in FIG. 7.

After patterning poly Si, a hole for the memory node contact shown in FIG. 7 is formed, which an interlayer film and a poly Si layer are continuously etched as far as the silicon substrate as shown in FIG. 10*a*.

Figure 10B:
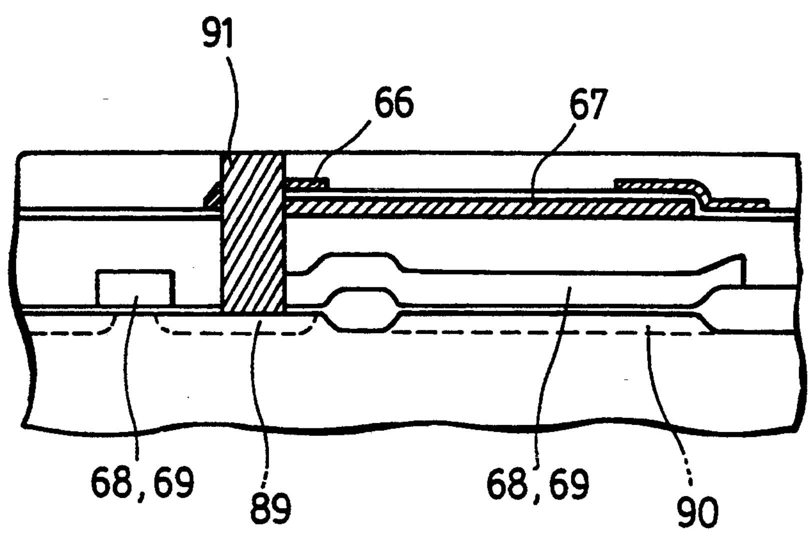

Then, ions are implanted to the inside of the contact hole, so that the diffusion layer portion of the transistor overlaps with the impurity distribution thereof (also refer to FIG. 10*b*).

Then, the contact hole is buried with poly Si as the conductive material 91, and the three poly Si layers (layers shown by 66, 67, 68 or 69) and a diffusion layer portion 89 of the silicon substrate are conducted to form a memory node.

For burying the conductive material 91 of the node contact hole, selective tungsten growing, entire CVD or etching back with tungsten may be applied in addition to the formation of poly Si described above.

In this embodiment, formation of two memory nodes of the SRAM cell can be completed only by a step of forming the contact hole, burying of the poly Si film to the contact portion and an appropriate etching back step only for once, which can realize remarkable saving for the number of steps.

As has been described above according to this embodiment, since contact for forming the two memory nodes in the SRAM cell is formed by a step of forming the contact hole only for once, it is possible to remarkably simplify the manufacturing steps and make a great contribution to the improvement of the yield.

According to the semiconductor device and the SRAM of the present invention, since a portion in which at least three layers having diffusion regions for forming a transistor are overlapped is formed and a contact is taken in this the portion, the number of steps for forming the contact can be reduced. Referring, for example, to a three-layered structure, two steps are required when the contact is formed in each of the two layers, whereas this can be done only by one step according to the present invention. In a case of a more-layered structure, this can provide a further advantage.

Further, in the manufacturing method according to the present invention, the semiconductor device and the SRAM having the foregoing advantages can be manufactured at a reduced number of steps and at a good yield.

The present invention provides a semiconductor device having an upper transistor and a lower transistor, wherein an overlapped portion in which at least three layers each having a diffusion region for forming each of the transistors are overlapped is formed and a contact is taken at the overlapped portion, by which the object of the present invention can be attained.

Further, the present invention provides a SRAM having a word transistor and a driver transistor, wherein an overlapped portion in which at least three layers each having a diffusion region for forming a load transistor formed and a contact is taken at the overlapped portion, by which the object of the present invention can be attained.

Further, the present invention provides a method of manufacturing a semiconductor device having an upper transistor and a lower transistor, which comprises forming an overlapped portion by overlapping at least three layers each having a diffusion layer forming each of the transistor, forming a contact hole penetrating the overlapped portion, and burying the contact hole with a conductive material thereby forming contact, by which the object of the present invention can be attained.

Furthermore, the present invention provides a method of manufacturing a TFT load type SRAM, which comprises forming at least three poly Si layers for forming the diffusion region, then forming a contact hole for node penetrating said at least three poly Si layers and burying the contact hole with a conductive material thereby forming a memory node, by which the object of the present invention can be attained.

What is claimed is:

1. An SRAM memory cell structure in which a word line is disposed near the center of a cell and each one of driver transistors is disposed on both sides thereof substantially in parallel with each other, wherein a contact portion for a gate electrode of said driver transistor is formed being laminated on a word transistor formed together with said word line.

2. An SRAM memory cell structure in which a word transistor and a driver transistor are formed on a substrate and a load device is laminated to an upper layer portion thereof, wherein a word line is disposed near the center of a cell, each one of said driver transistors is disposed on both sides thereof substantially in parallel with each other, a gate electrode of said driver transistor is partially laminated by way of an insulating film to said upper layer of an electrode for a channel portion of the word transistor, and said laminated portion is used for the contact for the gate electrode of said driver transistor.

3. An SRAM memory cell structure as defined in claim 1, wherein the gate electrode for the driver transistor is formed subsequent to a step of forming the word line.

4. An SRAM memory cell structure as defined in any one of claims 1 to 3, wherein the word line is disposed near the center of the cell, and each one of said driver transistors is disposed on both sides thereof substantially in parallel and about in a point-to-point symmetry.

5. A semiconductor device having an upper transistor and a lower transistor, wherein an overlapped portion comprising at least three overlapping layers each having a diffusion region for forming each of said transistors is formed, and a gate electrode contact is taken at said overlapped portion, said gate electrode contact formed on the channel of a word transistor.

* * * * *